United States Patent
Kozakai et al.

(10) Patent No.: US 7,244,495 B2
(45) Date of Patent: Jul. 17, 2007

(54) DICING/DIE BONDING ADHESION TAPE

(75) Inventors: Shouhei Kozakai, Usui-gun (JP); Akio Suzuki, Usui-gun (JP); Nobuhiro Ichiroku, Usui-gun (JP); Toshio Shiobara, Usui-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 258 days.

(21) Appl. No.: 10/829,150

(22) Filed: Apr. 22, 2004

(65) Prior Publication Data
US 2004/0213994 A1 Oct. 28, 2004

(30) Foreign Application Priority Data
Apr. 25, 2003 (JP) ............... 2003-121717

(51) Int. Cl.
C09J 7/02 (2006.01)
B32B 7/12 (2006.01)

(52) U.S. Cl. ................ 428/354; 428/343; 428/355 R; 428/355 EP; 428/355 CN; 428/447; 428/448

(58) Field of Classification Search ................ 428/343, 428/354, 355 R, 355 EP, 355 CN, 447, 448
See application file for complete search history.

(56) References Cited

U.S. PATENT DOCUMENTS 6,007,920 A * 12/1999 Umehara et al. ........ 428/473.5
6,638,607 B1 * 10/2003 Curcio et al. ............... 428/209
2004/0044132 A1 * 3/2004 Kozakai et al. ............ 525/100
2004/0068076 A1 * 4/2004 Kozakai et al. ............. 528/15
2004/0213994 A1 * 10/2004 Kozakai et al. ............ 428/354

FOREIGN PATENT DOCUMENTS

| JP | 9-67558 A | 3/1997 |
| JP | 2984549 B2 | 9/1999 |
| JP | 2002-256236 A | 9/2002 |

OTHER PUBLICATIONS

Japanese Patent Abstract Publication 08-027239 dated Jan. 30, 1996.*

* cited by examiner

Primary Examiner—Daniel Zirker
(74) Attorney, Agent, or Firm—Birch, Stewart, Kolasch & Birch, LLP

(57) ABSTRACT

A dicing/die bonding adhesion tape includes a substrate, a silicone adhesive layer, and a bonding layer. A tack strength of 0.2–2.0 N/25 mm is developed between the silicone adhesive layer and the bonding layer. The bonding layer is formed of a bonding composition comprising (A) a polyimide resin, (B) an epoxy resin, and (C) an epoxy resin curing catalyst.

9 Claims, 2 Drawing Sheets

DICING/DIE BONDING ADHESION TAPE

This Nonprovisional application claims priority under 35 U.S.C. § 119(a) on Patent Application No(s). 2003-121717 filed in JAPAN on Apr. 25, 2003, the entire contents of which are hereby incorporated by reference.

FIELD OF THE INVENTION

This invention relates to a dicing/die bonding adhesion tape which having both functions of securing a wafer in a wafer dicing step in the semiconductor device manufacturing process and of bonding chips resulting from the dicing step to lead frames.

BACKGROUND ART

In the manufacture of semiconductor devices, a large diameter silicon wafer is secured by an adhesion tape (known as dicing tape) and subjected to a dicing (sawing and separating) step where the wafer is divided into semiconductor chips. The chips are then peeled from the dicing tape. Each chip is picked up and secured to a lead frame with a curable liquid adhesive (or die bonding agent) through heat compression bonding. In the current industry, a rational process capable of carrying out dicing and die bonding steps continuously is needed, and the contamination of semiconductor parts with fluid ingredients from the liquid adhesive and the squeeze-out of the adhesive from chip securing sites are also issues of concern. It is then desired to have a dicing/die bonding tape in the form of an adhesion sheet having an adhesive layer of non-liquid adhesive and possessing both the wafer-securing function of dicing tape and the bonding function of die bonding agent. The dicing/die bonding tape needs to develop a tack force (or attachment) enough to prevent chips as diced from being moved or released during the dicing step, to adhere to the chip being taken away in the pickup step, and to develop a strong bond to the lead frame in the subsequent die bonding step.

Such a dicing/die bonding tape is disclosed in JP-A 9-67558 as a sheet comprising a plastic film substrate and a dicing/die bonding layer of thermoplastic polyimide resin. In an embodiment, a wafer is secured to the polyimide resin layer in close contact with the substrate by heat compression, and is diced in this state. Each chip is picked up with the polyimide resin layer bonded thereto and attached to a lead frame by heat compression and heat bonded thereto.

However, since the polyimide resin layer and the wafer are firmly joined by heat compression, the wafer holding and chip pickup depend on the bond between the substrate and the polyimide resin layer and are not easily controlled. Another drawback is that the adhesive layer of thermoplastic polyimide resin are insufficient in adhesion, especially adhesion in moist conditions, adhesion at elevated temperature and strength which are required in wire bonding, sealing and solder reflow steps during the manufacture of semiconductor devices.

JP-A 2002-256236 discloses a dicing/die bonding tape in which a layer of a resin composition comprising (A) a polyimide resin, (B) an epoxy resin, (C) a phenolic resin, and (D) a curing accelerator, which composition is improved in adhesion in moist conditions and adhesion at elevated temperature, is formed on a film substrate having thereon a radiation-polymerizable adhesive layer capable of controlling bonding or adhesion as reported in Japanese Patent No. 2,984,549.

This die bonding layer composed of the curable epoxy resin composition is improved in adhesion in moist conditions, adhesion at elevated temperature and strength, but sometimes hinders the chips as diced from being picked up. More particularly, the radiation-polymerizable adhesive layer which controls the adhesion between the substrate and the die bonding layer as reported in Japanese Patent No. 2,984,549 is formed of a composition comprising a (meth) acrylate copolymer, (meth)acrylic radical-containing polymer or polyfunctional acrylic compound and a photo-polymerization initiator. This composition is compatible with the die bonding layer. On account of reaction due to UV exposure or fusion between the adhesive and the die bonding layer which is softened by heat compression for wafer holding in the dicing step, the tack strength is increased to prevent the chips from being easily picked up. The tack strength (or adhesive property) between the die bonding layer and the radiation-polymerizable adhesive layer changes or increases with the passage of time, also preventing the chips from being easily picked up.

SUMMARY OF THE INVENTION

An object of the invention is to provide a dicing/die bonding tape capable of holding a wafer at a level to withstand dicing and stabilizing the tack strength (or adhesive property) to the die bonding layer so as to allow for easy pickup of chips, and having improved adhesion to lead frames.

The inventors have found that by using a curable polyimide/epoxy resin composition having improved adhesion as a die bonding layer that can be bonded to a wafer by heat compression, and interposing a silicone adhesive layer, which is incompatible with the die bonding layer, between the die bonding layer and the substrate, there is obtained a dicing/die bonding adhesion tape in which the tack strength between layers is controllable, and the heat fusion and tack strength change little with time, and which ensures consistent dicing and chip pickup operations and improved adhesion for die bonding.

The present invention provides a dicing/die bonding adhesion tape comprising a substrate, a silicone adhesive layer on the substrate, and a bonding layer on the silicone adhesive layer. A tack strength of 0.2 to 2.0 N/25 mm is developed between the silicone adhesive layer and the bonding layer. The bonding layer is formed of an bonding composition comprising (A) a polyimide resin, (B) an epoxy resin, and (C) an epoxy resin curing catalyst as essential components.

Using the dicing/die bonding adhesion tape of the invention, the dicing and die bonding steps in a semiconductor device manufacturing process can be carried out in a stable manner. As a result, semiconductor devices having improved adhesion under moist conditions, improved adhesion at elevated temperature, high strength and high reliability can be manufactured.

DESCRIPTION OF THE PREFERRED EMBODIMENTS

Figure 1:
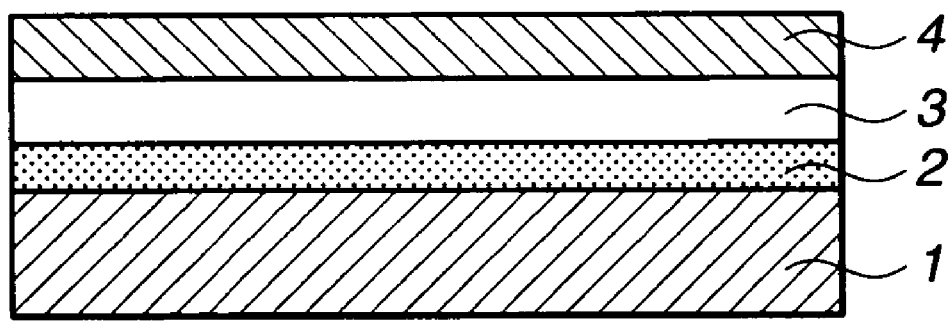
FIG. 1 is a schematic cross-sectional view of a dicing/die bonding adhesion tape according to one embodiment of the invention.

The dicing/die bonding adhesion tape of the invention includes a silicone adhesive layer on a substrate, and a bonding layer on the silicone adhesive layer, which is formed of a bonding composition comprising (A) a polyimide resin, (B) an epoxy resin, and (C) an epoxy resin curing catalyst as essential components.

Silicone Adhesive Film

In the dicing/die bonding adhesion tape of the invention, the silicone adhesive layer-bearing substrate is selected from, for example, polyolefin films such as polyethylene films, polypropylene films, polybutadiene films, polybutene films, polymethylpentene films, polyvinyl chloride films, and films of copolymers thereof, polyester films such as polyethylene terephthalate films and polybutylene terephthalate films, (meth)acrylic acid copolymer films, vinyl acetate copolymer films, polyether ketone films, polyetherether ketone films, polyether sulfone films, polyamide films, polyimide films, polyether imide films, polycarbonate films, and polystyrene films. Of these, extensible films are preferred for the reason that when chips are picked up after the dicing step, the chips as diced can be isolated by expanding the substrate. Suitable extensible films are general-purpose films such as polyethylene films and polypropylene films. These films may have been crosslinked or surface treated with a plasma or corona. Also useful is a laminate of these films or a laminate of any with another film.

The substrate film usually has a thickness of 20 to 400 μm, preferably 30 to 150 μm, although the thickness varies with the type of film and the desired extensibility.

The silicone adhesive layer on the substrate is formed of a silicone adhesive composition which is incompatible with the bonding layer. The silicone adhesive composition may be a silicone pressure-sensitive adhesive composition. The silicone adhesive composition used herein may be a customarily used silicone adhesive composition comprising a heat curable chain-like organopolysiloxane and a solid silicone resin. In the embodiment wherein an extensible polyethylene or polypropylene film is used as the substrate, a platinum addition-curable or radiation-curable silicone adhesive composition which requires a relatively small amount of heat on curing is especially preferred because the film can be deformed by heat.

Heat-curable silicone adhesive compositions include the organic peroxide curing type and the platinum addition curing type. The former composition comprises an organopolysiloxane mixture of an organopolysiloxane and an organopolysiloxane copolymer resin composed of $R^1_3SiO_{1/2}$ units and $SiO_2$ units (wherein $R^1$ is a substituted or unsubstituted monovalent hydrocarbon radical) wherein the molar ratio of $R^1_3SiO_{1/2}$ units to $SiO_2$ units is from 0.5 to 1.5, and an organic peroxide such as benzoyl peroxide, bis(4-methylbenzoyl)peroxide and 2,5-dimethyl-2,5-bis(t-butylperoxy) hexane as a crosslinking/curing agent. The latter composition comprises a vinyl-containing organopolysiloxane, the aforementioned organopolysiloxane copolymer resin, an organohydrogenpolysiloxane containing silicon atom-bonded hydrogen atoms as a crosslinking/curing agent, and a platinum group metal catalyst such as chloroplatinic acid, alcohol-modified chloroplatinic acid, platinum-olefin complex or platinum-vinyl siloxane complex as a catalyst.

The radiation-curable silicone adhesive composition comprises a radiation-curable organopolysiloxane having at least two radiation-curable radicals such as (meth)acrylic radicals, the aforementioned organopolysiloxane copolymer resin, and a photo-polymerization initiator such as benzophenone, 1-hydroxycyclohexyl phenyl ketone, 2-hydroxy-2-methyl-1-phenylpropan-1-one or 2,4,6-trimethylbenzoyldiphenylphosphine oxide.

The silicone adhesive composition used herein may be prepared by mixing suitable amounts of the above-mentioned components in a conventional manner.

The silicone adhesive layer formed of the silicone adhesive composition should have a tack strength of 0.2 to 2.0 N/25 mm relative to the bonding layer to be described later. If the tack strength is less than 0.2 N/25 mm, chips can be peeled off together with the bonding layer and scattered off during the dicing step. A tack strength of more than 2.0 N/25 mm impedes chips from being picked up. The preferred tack strength is 0.3 to 1.5 N/25 mm. The tack strength can be easily altered in accordance with the crosslinked density of the silicone adhesive composition and the content of silicone resin component.

Bonding Layer

The bonding layer (or die bonding layer) is formed of a bonding composition comprising (A) a polyimide resin, (B) an epoxy resin, and (C) an epoxy resin curing catalyst. It retains a shape at normal temperature, forms a film-like thin coating, cures by heat via a plastic state, and is fully adherent to chips and lead frames.

(A) Polyimide

The polyimide resins which can be used herein include their precursors, polyamic acid resins of the general formula (1) shown below. Upon heat curing during the die bonding step, polyamic acid resins can be imidized (dehydration and ring-closing reaction) to form by-product water, which causes separation at the bonding surface. It is then preferred to use polyimide resins having the general formula (2) shown below which are obtained by previously subjecting the polyamic acid resins to imidization (dehydration and ring-closing reaction). From the adhesion standpoint, polyimide resins having phenolic hydroxyl radicals on the skeleton are preferred.

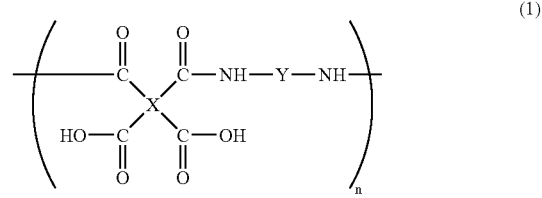

(1)

Herein, X is a tetravalent organic radical containing an aromatic ring or aliphatic ring, Y is a divalent organic radical, and n is an integer of 1 to 300.

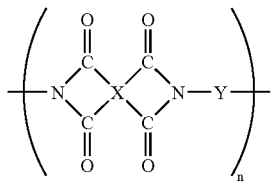
(2)

Herein, X is a tetravalent organic radical containing an aromatic ring or aliphatic ring, Y is a divalent organic radical, and n is an integer of 1 to 300.

In formula (1), n is an integer from 1 to 300, preferably an integer from 2 to 300, and more preferably an integer from 5 to 300. Polyamic acid resins having such a number of recurring units can be readily prepared by the process described below. Polyimide resins having the formula (2) are formed through dehydration and ring-closing reaction of polyamic acid resins having the formula (1) in a conventional manner.

The polyamic acid resins having the formula (1) can be prepared by reacting approximately equimolar amounts of a tetracarboxylic dianhydride of the structural formula (3) and a diamine of the structural formula (4) in an organic solvent in a conventional way.

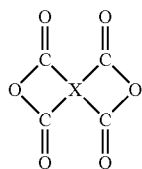
(3)

$H_2N-Y-NH_2$ (4)

Herein X and Y are as defined above.

Illustrative, non-limiting examples of the tetracarboxylic dianhydride of formula (3) are given below.

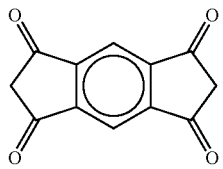

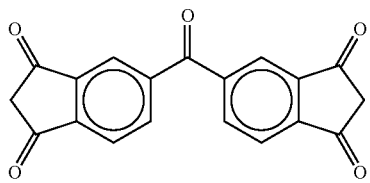

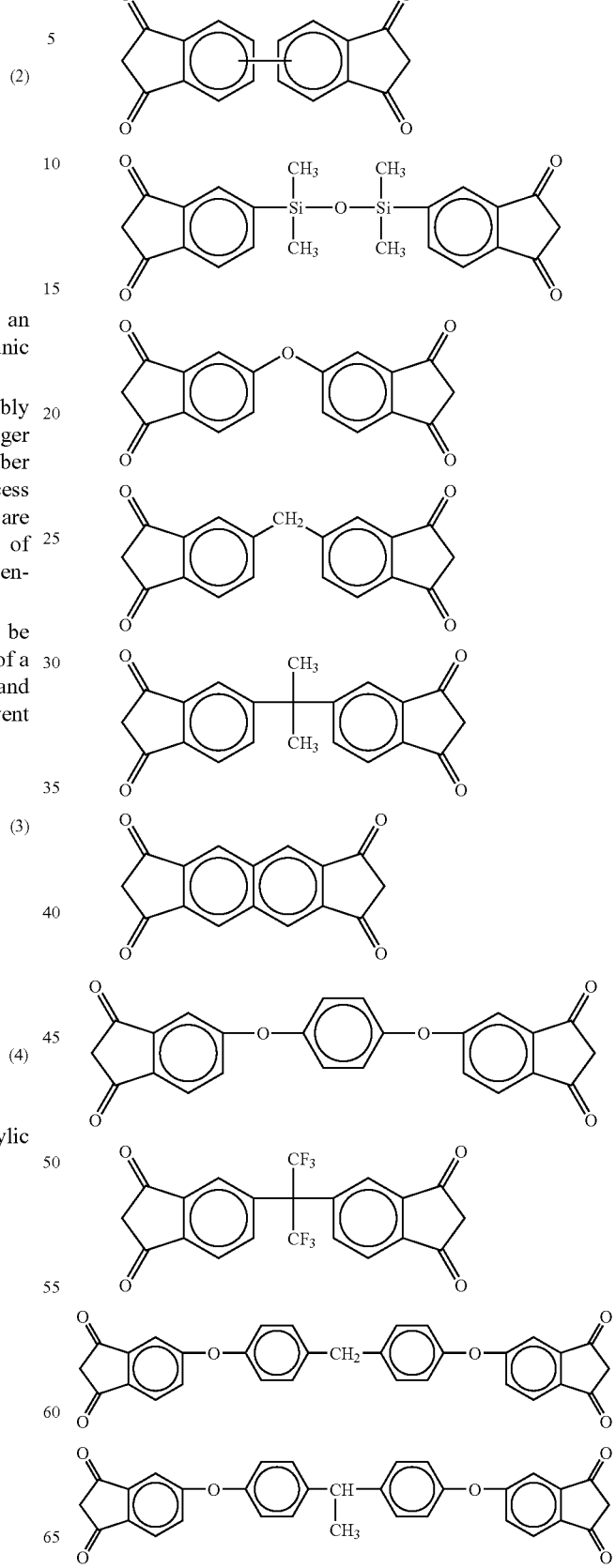

-continued

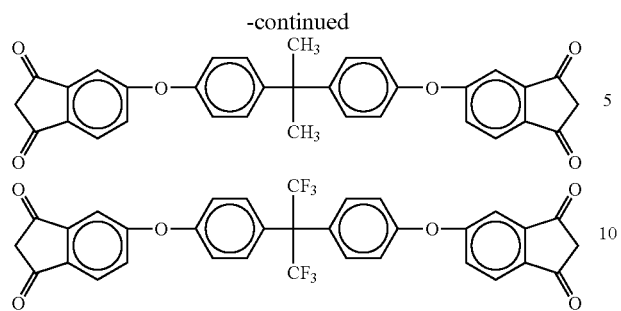

It is noted that the tetracarboxylic dianhydride of formula (3) may be used alone or in combinations of two or more.

With respect to the diamine of formula (4), it is preferred for dissolution in organic solvents, adhesion to substrates and flexibility that a diaminosiloxane compound of the structural formula (5) account for 1 to 80 mol %, more preferably 1 to 50 mol % of the diamine of formula (4).

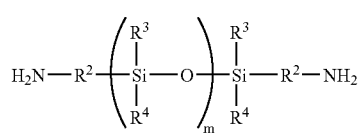

(5)

In formula (5), $R^2$ is a divalent organic radical having 3 to 9 carbon atoms, $R^3$ and $R^4$ are substituted or unsubstituted monovalent hydrocarbon radicals having 1 to 8 carbon atoms, and m is an integer of 1 to 200.

In the siloxanediamine or α, ω-diaminosiloxane having formula (5), typical divalent organic radicals of 3 to 9 carbon atoms represented by $R^2$ are divalent hydrocarbon radicals which may contain an ether oxygen atom, including alkylene radicals such as —$(CH_2)_3$—, —$(CH_2)_4$—, —$CH_2CH(CH_3)$—, —$(CH_2)_6$—, and —$(CH_2)_8$—, arylene radicals such as

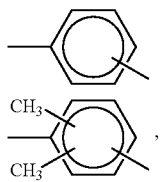 , 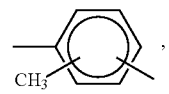 , alkylene-arylene radicals which are combinations of the foregoing radicals; oxyalkylene radicals such as —$(CH_2)_3$—O—, —$(CH_2)_4$—O—, oxyarylene radicals such as

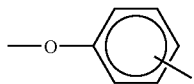 , 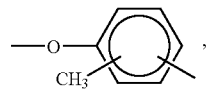 , and oxyalkylene-arylene radicals which are combinations of the foregoing radicals, such as

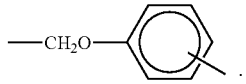 .

Suitable substituted or unsubstituted monovalent hydrocarbon radicals of 1 to 8 carbon atoms represented by $R^3$ and $R^4$ include alkyl radicals such as methyl, ethyl, propyl, isopropyl, butyl, isobutyl, tert-butyl, hexyl, cyclohexyl, 2-ethylhexyl, and octyl; alkenyl radicals such as vinyl, allyl, propenyl, isopropenyl, butenyl, isobutenyl, and hexenyl; aryl radicals such as phenyl, tolyl and xylyl; aralkyl radicals such as benzyl and phenylethyl; substituted ones of the foregoing in which some or all of the hydrogen atoms attached to carbon atoms are substituted with halogen atoms such as fluorine, bromine and chlorine, typically haloalkyl radicals such as chloromethyl, bromoethyl and 3,3,3-trifluoropropyl. Of these, methyl and phenyl are preferred. The letter m is an integer from 1 to 200, preferably an integer from 1 to 100, and more preferably an integer from 1 to 80.

Illustrative, non-limiting examples of the siloxanediamine having formula (5) are given below.

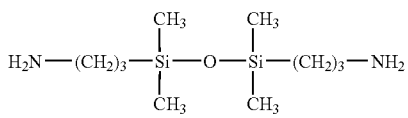

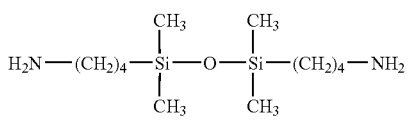

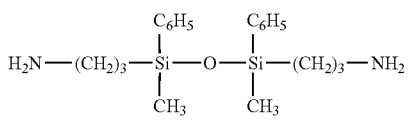

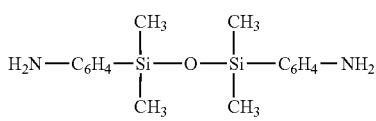

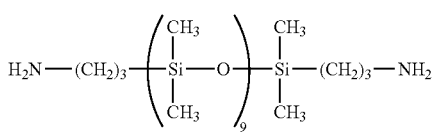

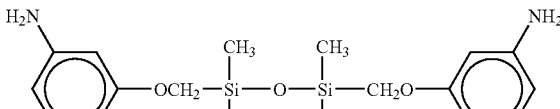

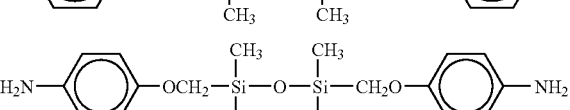

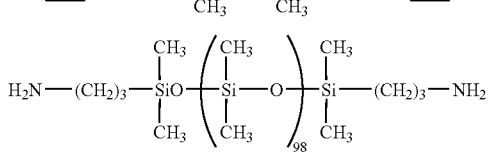

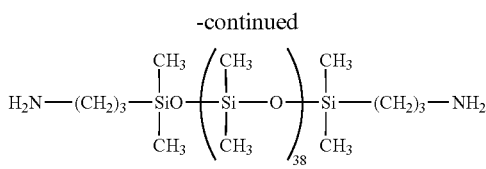

It is noted that the diaminosiloxanes of formula (5) may be used alone or in combinations of two or more.

While the diaminosiloxane of formula (5) has been described above, the diamine compounds of formula (4) other than that include a variety of aromatic ring-containing diamines, for example, p-phenylenediamine, m-phenylenediamine, 4,4'-diaminodiphenylmethane, 4,4'-diaminodiphenyl ether, 2,2'-bis(4-aminophenyl)propane, 4,4'-diaminodiphenylsulfone, 4,4'-diaminodiphenylsulfide, 1,4-bis(3-aminophenoxy)benzene, 1,4-bis(4-aminophenoxy)benzene, 1,4-bis(p-aminophenylsulfonyl)benzene, 1,4-bis(m-aminophenylsulfonyl)benzene, 1,4-bis(p-aminophenylthioether)benzene, 1,4-bis(m-aminophenylthioether)benzene, 2,2-bis[4-(4-aminophenoxy)phenyl]propane, 2,2-bis[3-methyl-4-(4-aminophenoxy)phenyl]propane, 2,2-bis[3-chloro-4-(4-aminophenoxy)phenyl]propane, 1,1-bis[4-(4-aminophenoxy)phenyl]ethane, 1,1-bis[3-methyl-4-(4-aminophenoxy)phenyl]ethane, 1,1-bis[3-chloro-4-(4-aminophenoxy)phenyl]ethane, 1,1-bis[3,5-dimethyl-4-(4-aminophenoxy)phenyl]ethane, bis[4-(4-aminophenoxy)phenyl]methane, bis[3-methyl-4-(4-aminophenoxy)phenyl]methane, bis[3-chloro-4-(4-aminophenoxy)phenyl]methane, bis[3,5-dimethyl-4-(4-aminophenoxy)phenyl]methane, bis[4-(4-aminophenoxy)phenyl]sulfone, and 2,2-bis[4-(4-aminophenoxy)phenyl]perfluoropropane. Of these, preferred are p-phenylenediamine, m-phenylenediamine, 4,4'-diaminodiphenylmethane, 4,4'-diaminodiphenylether, 1,4-bis(3-aminophenoxy)benzene, 1,4-bis(4-aminophenoxy)benzene, 2,2-bis[4-(4-aminophenoxy)phenyl]propane, and 2,2-bis[3-methyl-4-(4-aminophenoxy)phenyl]propane. These diamine compounds may be used alone or in admixture of two or more.

From the adhesive standpoint, the polyimide resin preferably has phenolic hydroxyl radicals on its polymer skeleton. Hydroxyl radicals may be introduced using a diamine compound having phenolic hydroxyl radicals. Suitable diamine compounds have the structure shown below.

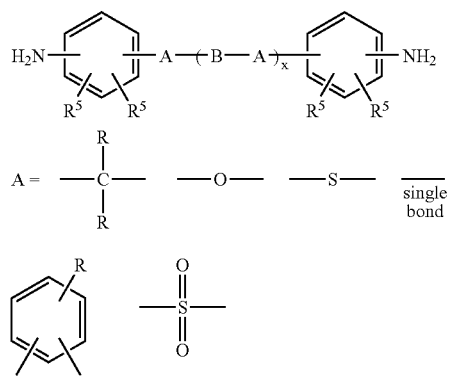

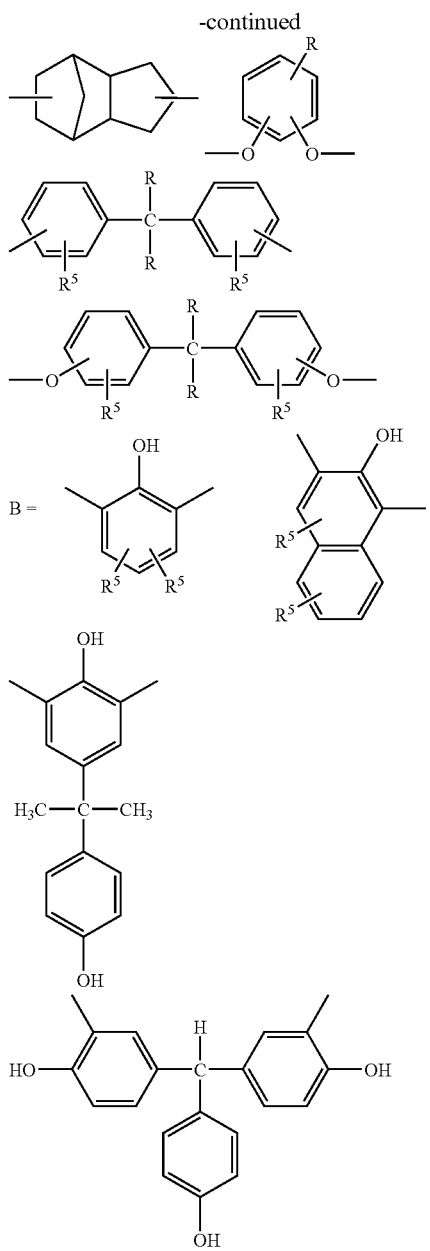

Herein, $R^5$ is a hydrogen atom, a halogen atom such as fluorine, bromine or iodine, or a substituted or unsubstituted monovalent hydrocarbon radical having 1 to 8 carbon atoms such as alkyl, alkenyl, alkynyl, trifluoromethyl and phenyl. Substituent radicals on each aromatic ring may be all identical or all different. The subscript x is an integer of 1 to 5. Each of A and B may be one species or a mixture of two or more species. R is a hydrogen atom, a halogen atom, or a substituted or unsubstituted monovalent hydrocarbon radical.

Examples of the substituted or unsubstituted monovalent hydrocarbon radical having 1 to 8 carbon atoms represented by $R^5$ includes those exemplified above for $R^3$ and $R^4$, and alkynyl radicals such as ethynyl, propynyl, butynyl, and hexynyl.

In the preparation of polyimide resins, the amount of the diamine compound having a phenolic hydroxyl radical is preferably 5 to 60% by weight, more preferably 10 to 40% by weight of the entire diamine compounds. Outside the range, too less amounts may lead to a weak bond force whereas too large amounts may result in a less flexible bonding layer.

For the introduction of phenolic hydroxyl radicals, a monoamine compound having phenolic hydroxyl radicals may also be used. Suitable monoamine compounds have the structure shown below.

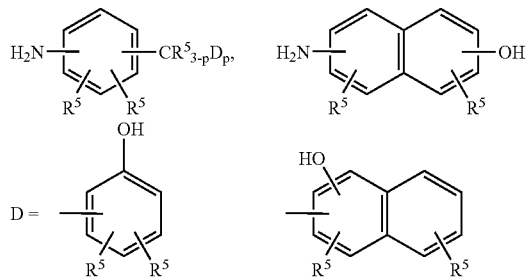

Herein, $R^5$ is a hydrogen atom, a halogen atom such as fluorine, bromine or iodine, or a substituted or unsubstituted monovalent hydrocarbon radical having 1 to 8 carbon atoms such as alkyl, alkenyl, alkynyl, trifluoromethyl and phenyl, examples of which are as described above for $R^5$ associated with the diamine compounds. Substituent radicals on each aromatic ring may be all identical or all different. D may be one species or a mixture of two or more species. The subscript p is an integer of 1 to 3.

When the monoamine compound having phenolic hydroxyl radicals is used, the amount is preferably 1 to 10 mol % of the entire diamine compounds.

The amine compounds are not limited to the foregoing. The amine compounds may be used alone or in admixture of two or more if desired.

Illustratively, the following reactions are conducted to form the polyamic acid resins and the polyimide resins. The starting reactants, described above, are dissolved in a solvent in an inert atmosphere, after which they are reacted at a temperature below 80° C., preferably 0 to 40° C., to synthesize a polyamic acid resin. The polyamic acid resin thus obtained is heated usually at a temperature of 100 to 200° C., preferably 150 to 200° C., to induce dehydration and ring-closure on the acid amide moiety of the polyamic acid resin, synthesizing a desired polyimide resin.

The organic solvent used in the above reactions may be one in which the starting reactants are not thoroughly dissolvable as long as it is inert to the resulting polyamic acid. Exemplary solvents include tetrahydrofuran, 1,4-dioxane, cyclopentanone, cyclohexanone, γ-butyrolactone, N-methylpyrrolidone, N,N-dimethylacetamide, N,N-dimethylformamide, and dimethyl sulfoxide. Of these, aprotic polar solvents are preferred, and N-methylpyrrolidone, cyclohexanone and γ-butyrolactone are most preferred. The solvents may be used alone or in admixture.

In order to facilitate the dehydration and ring-closing reaction, an azeotropic dehydrating agent such as toluene or xylene is desirably used. It is also possible to carry out dehydration and ring-closing reaction at a low temperature using an acetic anhydride/pyridine solvent mixture.

In order to regulate the molecular weight of the resin, a dicarboxylic anhydride (e.g., maleic anhydride, phthalic anhydride) and/or a monoamine (e.g., aniline, n-butylamine or the above-mentioned phenolic hydroxyl radical-containing monoamine) may be added. It is noted that the amount of dicarboxylic anhydride added is usually 0 to 2 parts by weight per 100 parts by weight of the tetracarboxylic dianhydride, and the amount of monoamine added is usually 0 to 2 parts by weight per 100 parts by weight of the diamine.

(B) Epoxy Resin

The epoxy resins (B) which can be used herein are preferably compounds having at least two epoxy radicals per molecule. Their molecular structure, molecular weight and the like are not critical. Suitable epoxy resins include, for example, diglycidyl ethers of bis(4-hydroxyphenyl)methane and 2,2'-bis(4-hydroxyphenyl)propane or halides thereof, and polycondensates thereof (so-called bisphenol F type epoxy resins and bisphenol A type epoxy resins); butadiene diepoxide, vinylcyclohexene dioxide, resorcinol diglycidyl ether, 1,4-bis(2,3-epoxypropoxy)benzene, 4,4'-bis(2,3-epoxypropoxy)diphenyl ether, 1,4-bis(2,3-epoxypropoxy)cyclohexene, bis(3,4-epoxy-6-methylcyclohexylmethyl)adipate, epoxy glycidyl ethers or polyglycidyl esters obtained by condensation of 1,2-dihydroxybenzene (or resorcinol), polyhydric phenols or polyhydric alcohols with epichlorohydrin, epoxy novolac resins (i.e., novolac type epoxy resins) obtained by condensation of novolac type phenolic resins (or halogenated novolac type phenolic resins) such as phenol novolac and cresol novolac with epichlorohydrin, epoxidized polyolefins (epoxidized by peroxidation process), epoxidized polybutadiene, naphthalene ring-containing epoxy resins, biphenyl type epoxy resins, phenol aralkyl type epoxy resins, biphenyl aralkyl type epoxy resins, and cyclopentadiene type epoxy resins.

It is acceptable to use a mono-epoxy compound in combination with the epoxy compound having at least two epoxy radicals per molecule. Exemplary mono-epoxy compounds include styrene oxide, cyclohexene oxide, propylene oxide, methyl glycidyl ether, ethyl glycidyl ether, phenyl glycidyl ether, allyl glycidyl ether, octylene oxide and dodecene oxide. The epoxy resin used herein is not limited to a single type and can be a mixture of two or more types.

The amount of the epoxy resin (B) compounded is preferably 5 to 200 parts by weight, more preferably 10 to 100 parts by weight per 100 parts by weight of the polyimide resin (A). Outside the range, too less amounts may lead to a weak bond force whereas too large amounts may result in a less flexible bonding layer.

In the bonding composition of the invention, a curing agent for the epoxy resin may be used. The epoxy resin curing agent may be selected from many various curing agents which are well known for epoxy resins in the art. Illustrative curing agents include amine compounds such as diethylenetriamine, triethylenetetramine, diethylaminopropylamine, N-aminoethylpiperadine, bis(4-amino-3-methylcyclohexyl)methane, m-xylyleneamine, menthanediamine, and 3,9-bis(3-aminopropyl)-2,4,8,10-tetraoxaspiro(5,5)undecane; modified aliphatic polyamines such as epoxy resin-diethylenetriamine adduct, amine-ethylene oxide adduct, and cyanoethylated polyamine; phenolic resins containing at least two phenolic hydroxyl radicals per molecule, such as bisphenol A, trimethylol allyloxyphenol, phenol novolac resins having a low degree of polymerization, epoxidized or butylated phenolic resins, and phenolic resins available under the trade name of Super Beckacite 1001 (Japan Rechhold Chemical Co., Ltd.), Hitanol 4010 (Hitachi Ltd.), Scado form L-9 (Scado Zwoll, Netherlands), and Methylon 75108 (General Electric Company); carbon resins available under the trade name of Beckamine P-138 (Japan Rechhold Chemical Co., Ltd.), Melan (Hitachi Ltd.) and U-Van 10R (Toyo Koatsu Kogyo Co., Ltd.); amino resins such as melamine resins and aniline resins; polysulfide resins having at least two mercapto radicals per molecule, as represented by the formula: HS(C$_2$H$_4$OCH$_2$OC$_2$H$_4$SS)$_n$C$_2$H$_4$OCH$_2$OC$_2$H$_4$SH wherein n is an integer of 1 to 10; and organic acids and acid anhydrides such as phthalic anhydride, hexahydrophthalic anhydride, tetrahydrophthalic anhydride, pyromellitic anhydride, methylnadic acid, dodecylsuccinic anhydride, and chlorendic anhydride. Of the foregoing curing agents, phenolic resins (specifically phenol novolac resins) are desired in imparting ease of molding and humidity resistance to the inventive composition and because of non-toxicity and relatively low cost. The curing agent used herein is not limited to a single type and mixtures of two or more types may be used depending on their cure ability.

The curing agent may be used in any desired amount depending on a particular type, and usually in an amount of 1 to 100 parts by weight, preferably 5 to 50 parts by weight per 100 parts by weight of the epoxy resin. Less than 1 part of the curing agent may be difficult for causing the inventive composition to cure whereas more than 100 parts of the curing agent may be uneconomical, require a longer time for curing because the epoxy resin is diluted therewith, and result in cured products with poor physical properties.

In the embodiment wherein a polyimide resin having phenolic hydroxyl radicals on its skeleton is used as component (A), the proportion of the polyimide resin compounded relative to the epoxy resin and phenolic resin curing agent is important. Since curing reaction takes place utilizing reaction of phenolic hydroxyl radicals with epoxy radicals, too small amounts of epoxy radicals may lead to an insufficient bonding force to an adherend and too large amounts of epoxy radicals may cause a modulus buildup due to the excess of epoxy resin, which is incompliant with the fabrication of a flexible bonding sheet. It is then desired that the amount of the epoxy resin and phenolic resin curing agent combined be 1 to 900 parts by weight, especially 5 to 400 parts by weight per 100 parts by weight of the polyimide resin.

No particular limit is imposed on the chemical equivalent ratio of the total of the phenolic resin curing agent and the polyimide resin having phenolic hydroxyl radicals on its skeleton to the epoxy resin although the ratio is preferably in the range between 0.7 and 1.3, more preferably between 0.8 and 1.2. Outside the range, the composition may change its properties with time.

Even in an embodiment wherein the phenolic resin is not used as the epoxy resin curing agent, the amounts of the polyimide resin and the epoxy resin compounded and their equivalent ratio may be the same as above.

(C) Curing Catalyst

The epoxy resin curing catalyst (C) used herein is not critical and includes phosphorus and amine base catalysts.

Suitable phosphorus catalysts include triphenylphosphine, triphenylphosphonium triphenylborate, tetraphenylphosphonium tetraphenylborate, and compounds of the following formula.

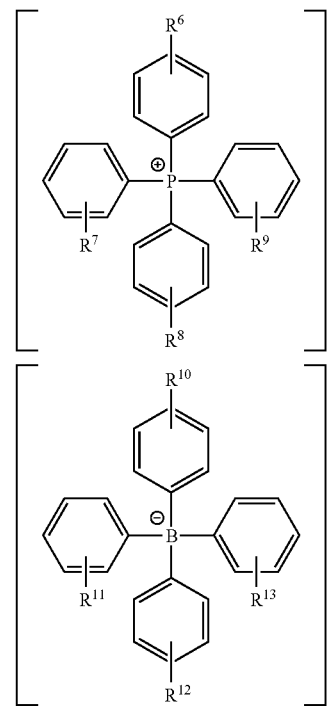

Herein R$^6$ to R$^{13}$ are selected from among hydrogen, halogen atoms (e.g., fluorine, bromine and iodine), and substituted or unsubstituted monovalent hydrocarbon radicals such as C$_{1-8}$ alkyl, alkenyl, alkynyl, C$_{1-8}$ alkoxy, trifluoromethyl and phenyl radicals. All these substituent radicals may be the same or different.

Examples of the monovalent hydrocarbon radicals represented by R$^6$ to R$^{13}$ include those exemplified above for R$^5$, and alkoxy radicals such as methoxy, ethoxy, propoxy, isopropoxy and butoxy.

Suitable amine catalysts include imidazole derivatives such as 2-methylimidazole, 2-ethyl-4-methylimidazole, 1-cyanoethyl-2-methylimidazole and 2-phenyl-4,5-dihydroxymethylimidazole. The curing catalysts may be used alone or in admixture of any. The epoxy resin curing catalyst (C) is compounded in a catalytic amount.

Various additives may be added to the resin composition of the invention if necessary and insofar as this does not compromise the objects of the invention. Suitable additives include fillers such as silica flour, alumina, titanium oxide, carbon black and electroconductive particles, coloring agents such as inorganic or organic pigments and dyes, wetting agents, antioxidants, and heat stabilizers.

The bonding composition of the invention of which the bonding layer is made can be prepared by mixing (A) polyimide resin, (B) epoxy resin, (C) epoxy resin curing agent and optional components in a conventional manner.

Adhesion Tape

It is now described how to prepare the dicing/die bonding adhesion tape of the invention. First, the silicone adhesive composition is applied onto a substrate, typically a plastic film, and then heated or exposed to radiation such as UV radiation or electron beams for curing, thereby forming a silicone adhesive layer. The substrate having the silicone adhesive layer formed thereon is referred to as "silicone adhesive film," hereinafter. The substrate used herein may be selected from the above-described films, preferably extensible films, and especially general-purpose polyethylene and polypropylene films. These films may be surface treated, for example, by corona treatment, prior to use. The silicone adhesive layer preferably has a thickness of 5 to 100 µm, more preferably 10 to 50 µm. Preferred curing conditions include a heating temperature of usually 60 to 120° C. in the case of heat curing, though the temperature depends on the heat resistance of the plastic film substrate, and an exposure dose of 200 to 2,000 mJ/cm$^2$ in the case of UV curing.

Next, the bonding composition is dissolved in an aprotic polar solvent (e.g., toluene, cyclohexanone, NMP) in an appropriate concentration. The solution is applied onto a support substrate and dried to form a bonding layer. The support substrate having the bonding layer formed thereon is referred to as "bonding film," hereinafter. The support substrate used herein may be selected from among polyethylene, polypropylene, polyester, polyamide, polyimide, polyamide-imide, polyether-imide, polytetrafluoroethylene, paper, metal foil, and the like, whose surface may be treated to impart release properties. The thickness of the bonding layer is not particularly limited and may be selected in accordance with a particular purpose although it is preferably 5 to 200 µm, more preferably 10 to 100 µm.

The bonding film is laid on the silicone adhesive film under pressure so that the bonding layer is in close contact with the silicone adhesive layer, yielding a dicing/die bonding adhesion tape of the invention.

On use of the dicing/die bonding adhesion tape of the invention, the substrate film on the bonding layer side is peeled off to expose the bonding layer, and a wafer is joined to the bonding layer by heat compression. In this way, the wafer is fastened to the dicing/die bonding adhesion tape. Heat compression conditions may be selected in accordance with the composition of the bonding layer and usually include a temperature of 60 to 120° C. and a pressure of 0.01 to 0.2 MPa. The assembly is mounted on a dicing apparatus where the wafer is diced into chips. At the end of dicing, the silicone adhesive layer and the substrate are peeled, and chips having the bonding layer attached thereto are picked up. The chips are attached to lead frames by heat compression and heat cured thereto. Heat compression conditions may be similar to those used for the wafer-bonding layer heat compression. Heat curing conditions may be selected in accordance with the composition of the bonding layer although a temperature of 120 to 250° C. is typical.

Figure 2:
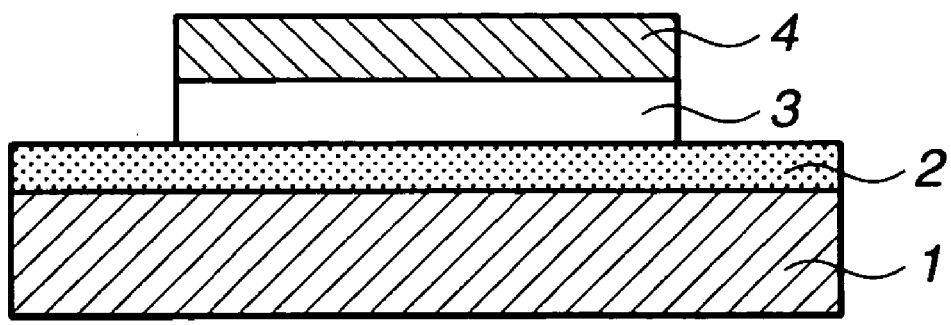
FIG. 2 is a schematic cross-sectional view of a dicing/die bonding adhesion tape according to another embodiment of the invention.
Figure 3:
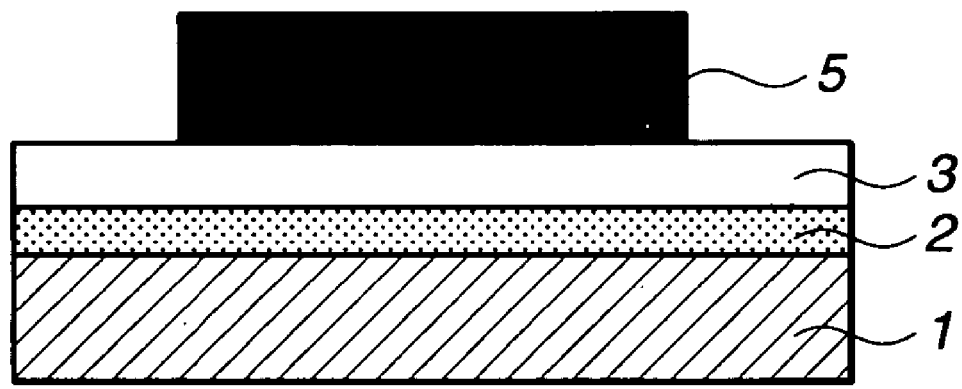
FIG. 3 is a schematic cross-sectional view of the dicing/die bonding adhesion tape of one embodiment to which a silicon wafer is secured.
Figure 4:
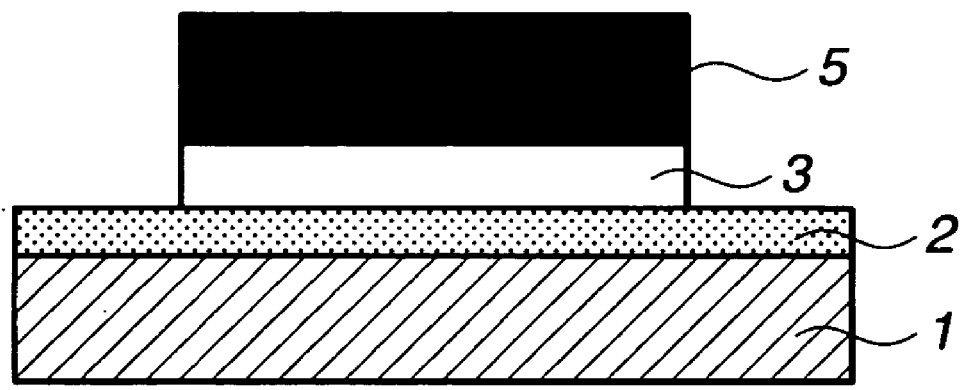
FIG. 4 is a schematic cross-sectional view of the dicing/die bonding adhesion tape of the other embodiment to which a silicon wafer is secured.

The dicing/die bonding adhesion tape of the invention may be constructed as shown in FIGS. 1 and 2. In these figures, the adhesion tape includes a silicone adhesive film substrate 1, a silicone adhesive layer 2, a bonding layer 3, and a bonding film substrate 4. In the tape of FIG. 2, the size of the bonding layer 3 is made smaller than the silicone adhesive layer 2 and in accordance with the shape and size of a silicon wafer to be bonded thereto. FIGS. 3 and 4 show the tapes of FIGS. 1 and 2 from which the bonding film substrate 4 has been removed, and to which a silicon wafer 5 is bonded instead.

The dicing/die bonding adhesion tape of the invention can be used not only in the manufacture of semiconductor devices, but also in the manufacture of various devices involving dicing and bonding steps. It may also be used simply as adhesion tapes of various substrates.

EXAMPLE

Examples of the invention are given below by way of illustration and not by way of limitation.

Preparation of Silicone Adhesive Composition

Preparation Example 1

58.33 parts by weight of a toluene solution containing 60 wt % a methylpolysiloxane resin consisting of 1.1 mol of $(CH_3)_3SiO_{1/2}$ units and 1 mol of $SiO_2$ units was combined with 65 parts by weight of a dimethylpolysiloxane terminated with an acrylic radical and having a degree of polymerization of 250, from which toluene was distilled off in vacuo at 100° C. The mixture was cooled to room temperature, after which 1.5 parts by weight of 2-hydroxy-2-methyl-1-phenylpropan-1-one was added as a photo-polymerization initiator, yielding a silicone adhesive composition I.

Preparation Example 2

A silicone adhesive composition II was prepared as in Preparation Example 1 aside from using 71.67 parts by weight of a toluene solution containing 60 wt % a methylpolysiloxane resin consisting of 1.1 mol of $(CH_3)_3SiO_{1/2}$ units and 1 mol of $SiO_2$ units, 57 parts by weight of a dimethylpolysiloxane terminated with an acrylic radical and having a degree of polymerization of 250, and 1.5 parts by weight of 2-hydroxy-2-methyl-1-phenylpropan-1-one as a photo-polymerization initiator.

Preparation Example 3

A silicone adhesive composition III was prepared as in Preparation Example 1 aside from using 80 parts by weight of a toluene solution containing 60 wt % a methylpolysiloxane resin consisting of 1.1 mol of $(CH_3)_3SiO_{1/2}$ units and 1 mol of $SiO_2$ units, 52 parts by weight of a dimethylpolysiloxane terminated with an acrylic radical and having a degree of polymerization of 250, and 1.5 parts by weight of 2-hydroxy-2-methyl-1-phenylpropan-1-one as a photo-polymerization initiator.

Preparation Example 4

A silicone adhesive composition IV was prepared as in Preparation Example 1 aside from using 45 parts by weight of a toluene solution containing 60 wt % a methylpolysiloxane resin consisting of 1.1 mol of $(CH_3)_3SiO_{1/2}$ units and 1 mol of $SiO_2$ units, 73 parts by weight of a dimethylpolysiloxane terminated with an acrylic radical and having a degree of polymerization of 250, and 1.5 parts by weight of 2-hydroxy-2-methyl-1-phenylpropan-1-one as a photo-polymerization initiator.

Preparation Example 5

A silicone adhesive composition V was prepared as in Preparation Example 1 aside from using 83.33 parts by weight of a toluene solution containing 60 wt % a methylpolysiloxane resin consisting of 1.1 mol of $(CH_3)_3SiO_{1/2}$ units and 1 mol of $SiO_2$ units, 50 parts by weight of a dimethylpolysiloxane terminated with an acrylic radical and having a degree of polymerization of 250, and 1.5 parts by weight of 2-hydroxy-2-methyl-1-phenylpropan-1-one as a photo-polymerization initiator.

Preparation Example 6

79.17 parts by weight of a toluene solution containing 60 wt % a methylpolysiloxane resin consisting of 1.1 mol of $(CH_3)_3SiO_{1/2}$ units and 1 mol of $SiO_2$ units, 52.5 parts by weight of a gum-like dimethylpolysiloxane containing 0.002 mol/100 g of vinyl radicals at ends and side chains and having a degree of polymerization of 2,000 were dissolved in 118.33 parts by weight of toluene until uniform. The solution was mixed with 0.41 parts by weight of an organopolysiloxane compound having silicon atom-bonded hydrogen atoms represented by the structural formula below, an amount of a 2-ethylhexanol solution of chloroplatinic acid in an amount to give 40 ppm of platinum, and 0.15 part by weight of 3-methyl-1-butyn-3-ol as a reaction inhibitor, yielding a silicone adhesive composition VI.

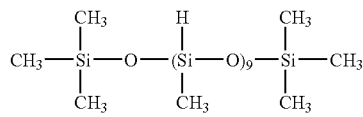

Preparation Example 7

To 100 parts by weight of a 25 wt % ethyl acetate solution of a copolymer consisting of 75 parts by weight of butyl acrylate and 25 parts by weight of 2-hydroxyethyl acrylate and having a weight average molecular weight of 290,000 was added 0.05 part by weight of dibutyltin dilaurate. To the mixed solution, a mixed solution of 6.7 parts by weight of methacryloyloxyethyl isocyanate and 7 parts by weight of ethyl acetate was added dropwise. After the completion of dropwise addition, the solution was stirred and heated at 60° C. until the absorption of isocyanate on IR absorption spectroscopy analysis disappeared. An acrylate polymer having methacrylic radicals was obtained. By mixing 71.4 parts by weight of this solution, 33 parts by weight of a 25 wt % ethyl acetate solution of a copolymer consisting of 75 parts by weight of butyl acrylate and 25 parts by weight of 2-hydroxyethyl acrylate and having a weight average molecular weight of 290,000, 0.5 part by weight of a polyvalent isocyanate compound (Colonate L, Nippon Polyurethane Co., Ltd.), and 1 part by weight of 1-hydroxycyclohexyl phenyl ketone (Irgacure 184, Ciba Geigy) as a photo-polymerization initiator, there was prepared a UV-curable adhesive composition I which would reduce a tack strength to stainless steel (SUS) or wafer upon exposure to UV radiation.

Preparation of Adhesive Film

Each of silicone adhesive compositions I to V was applied onto a non-stretched polypropylene of 100 μm thick whose surface had been corona treated, to form a coating of 30 μm thick. A PET film of 50 μm thick coated with a fluorosilicone release agent was laminated thereto. By exposure to UV radiation having an energy of 1,000 $mJ/cm^2$ through the polypropylene surface, the silicone PSA composition was cured. In this way, silicone adhesive films I to V were prepared.

Silicone adhesive composition II was applied onto a non-stretched polyethylene of 100 μm thick whose surface had been corona treated, to form a coating of 30 μm thick. The silicone adhesive composition was similarly cured, obtaining a silicone adhesive film VI.

Silicone adhesive composition VI was applied onto a non-stretched polypropylene of 100 μm thick whose surface had been corona treated, and heated at 100° C. for 10 minutes to form an adhesive layer of 30 μm thick, obtaining a silicone adhesive film VII.

UV-curable adhesive composition I was applied onto a non-stretched polypropylene of 100 μm thick whose surface had been corona treated, and heated at 100° C. for 1 minute to form an adhesive layer of 30 μm thick, obtaining a UV-curable adhesive film I.

Synthesis of Polyimide Resin

Synthesis Example 1

A 1-liter separable flask equipped with a 25-ml water metering receiver coupled to a reflux condenser through a cock, a thermometer and a stirrer was charged with 44.03 parts by weight of a diaminosiloxane KF-8010 (Shin-Etsu Chemical Co., Ltd.) and 100 parts by weight of cyclohexanone as a reaction solvent. By stirring at 80° C., the diaminosiloxane was dispersed. A solution of 38.72 parts by weight of 6FDA (2,2-bis(3,4-dicarboxyphenyl)hexafluoropropane) as an acid anhydride in 100 parts by weight of cyclohexanone was added dropwise to the dispersion. The solution was stirred for 8 hours at 80° C. for reaction, thereby synthesizing an acid anhydride-rich amic acid oligomer.

Next, a 1-liter separable flask equipped with a 25-ml water metering receiver coupled to a reflux condenser through a cock, a thermometer and a stirrer was charged with 17.25 parts by weight of a phenolic hydroxyl radical-containing aromatic diamine (Diamine 1) shown below and 100 parts by weight of cyclohexanone, which were dispersed. The acid anhydride-rich polyamic acid solution was added dropwise to the dispersion. Toluene, 25 ml, was then admitted, after which the temperature was elevated to about 160° C., at which reflux continued for 2 hours. It was confirmed that a predetermined amount of water collected in the water metering receiver and the outflow of water ceased. While the water metering receiver was freed of the effluent, the toluene was removed completely at 160° C. At the end of reaction, there was obtained 400 parts by weight of a cyclohexanone solution of a polyimide resin having phenolic hydroxyl radicals in its skeleton. After the solvent was distilled off from the solution, vacuum drying yielded a polyimide resin I.

Diamine 1

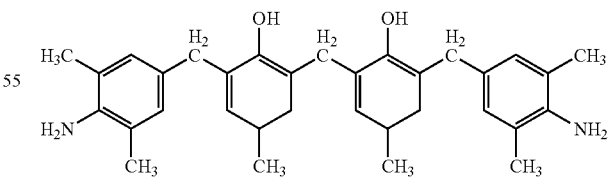

The infrared absorption spectrum of the polyimide resin was measured. The spectrum was free of an absorption peak attributable to polyamic acid and indicating the presence of unreacted functional radicals. Absorption peaks due to imide radicals were observed at 1780 $cm^{-1}$ and 1720 $cm^{-1}$. An absorption peak due to phenolic hydroxyl radicals was found at 3500 $cm^{-1}$.

Synthesis Example 2

The system, operation and analysis were the same as in Synthesis Example 1 aside from using 14.73 parts by weight of 2,2-bis(4-(4-aminophenoxy)phenyl)propane instead of 17.25 parts by weight of Diamine 1. A polyimide resin II was obtained.

Preparation of Bonding Composition

Preparation Example 8

In 50 parts by weight of cyclohexanone was dissolved 50 parts by weight of polyimide resin I obtained in Synthesis Example 1. This solution was mixed with 50 parts by weight of a liquid epoxy resin RE310S (Nippon Kayaku Co., Ltd.) and 2.5 parts by weight of an imidazole curing catalyst 2PZ (Shikoku Chemicals Co., Ltd.), yielding a bonding composition I.

Preparation Example 9

In 60 parts by weight of cyclohexanone was dissolved 40 parts by weight of polyimide resin II obtained in Synthesis Example 2. This solution was mixed with 27.2 parts by weight of an epoxy cresol novolac resin having an epoxy equivalent of 220, EOCN-102 (Nippon Kayaku Co., Ltd.), 12.8 parts by weight of a phenol novolac resin MP-120 (Gunei Chemical Co., Ltd.) and 1.0 part by weight of triphenylphosphine as a curing accelerator, yielding a bonding composition II.

Preparation Example 10

40 parts by weight of polyimide resin II obtained in Synthesis Example 2 was mixed and dissolved in 60 parts by weight of cyclohexanone, yielding a bonding composition III.

Preparation of Adhesion Film

Each of the above-prepared bonding compositions was applied onto a PET film of 50 μm thick coated with a fluorosilicone release agent and heated at 80° C. for 30 minutes for drying, to form a bonding layer of about 50 μm thick, obtaining a bonding film. Bonding films I, II, and III were prepared from the bonding compositions I, II, and III, respectively.

Preparation of Dicing/Die Bonding Tape

Example 1

The adhesive layer of silicone adhesive film I and the bonding layer of bonding film I were press bonded together by means of a press roll of 300 mm wide, preparing a dicing/die bonding tape I.

Example 2

A dicing/die bonding tape II was prepared as in Example 1 by combining silicone adhesive film II with bonding film I.

Example 3

A dicing/die bonding tape III was prepared as in Example 1 by combining silicone adhesive film III with bonding film I.

Example 4

A dicing/die bonding tape IV was prepared as in Example 1 by combining silicone adhesive film VI with bonding film I.

Example 5

A dicing/die bonding tape V was prepared as in Example 1 by combining silicone adhesive film VII with bonding film I.

Example 6

A dicing/die bonding tape VI was prepared as in Example 1 by combining silicone adhesive film II with bonding film II.

Comparative Example 1

A dicing/die bonding tape VII was prepared as in Example 1 by combining silicone adhesive film IV with bonding film I.

Comparative Example 2

A dicing/die bonding tape VIII was prepared as in Example 1 by combining silicone adhesive film V with bonding film I.

Comparative Example 3

A dicing/die bonding tape IX was prepared as in Example 1 by combining UV-curable adhesive film I with bonding film I.

Comparative Example 4

A dicing/die bonding tape X was prepared as in Example 1 by combining silicone adhesive film II with bonding film III.

Test were performed using the dicing/die bonding tapes I to X obtained in Examples and Comparative Examples. The tests include a dicing and chip pick-up test, an adhesion test, a post-PCT adhesion test, and tack strength measurement. The test results of Examples and Comparative Examples are shown in Table 1.

Dicing and Chip Pick-Up Test

The substrate film on the bonding layer side was peeled from the dicing/die bonding tape, and instead, a 6-inch wafer was secured to the tape by heat compression at 80° C. and 0.01 MPa for 30 seconds. The wafer was diced into chips of 10 mm square. Each chip was picked up using a suction collet having a diameter of 8 mm. It was observed whether chips were scattered during the dicing operation and whether chips were smoothly picked up.

Adhesion Test

The dicing/die bonding tape was cut into a piece of 5 mm×5 mm. The substrate film on the bonding layer side was peeled therefrom. An Alloy 42 test specimen of 18 mm×18 mm (KAKU-42, Toppan Printing Co., Ltd.) was secured to the tape piece by heat compression at 80° C. and 0.01 MPa for 30 seconds. Thereafter, the adhesive layer and the substrate were peeled off, and a second Alloy 42 test specimen of 18 mm×18 mm was secured thereto by heat compression under the same conditions. The pressure bonded laminate was heat treated at 175° C. for one hour for curing the bonding layer, completing an adhesion test sample. Using an autograph tensile tester (Shimadzu Mfg. Co., Ltd.), a shear bond strength was measured at a speed of 2.0 mm/min.

Post-PCT Adhesion Test

The adhesion test sample was held under pressure cooker test conditions (120° C./2.1 atm) for 24 hours before a shear bond strength was measured at a speed of 2.0 mm/min using an autograph tensile tester (Shimadzu Mfg. Co., Ltd.).

Tack Strength Measurement

The dicing/die bonding tape was cut into a tape strip of 25 mm wide. The substrate film on the bonding layer side was peeled therefrom. A stainless steel plate SUS27CP (gage 1.0 mm, width 30 mm) was secured to the bonding layer of the tape strip by heat compression at 80° C. and 0.01 MPa for 60 seconds. This sample was held under constant temperature/humidity conditions of 25±2° C. and 50±5% RH over 30 minutes. Thereafter, the adhesive film was folded back 180° at the interface between the bonding layer and the adhesive layer and pulled back at a speed of 300 mm/min, during which time a peeling force was measured.

It is noted that in Comparative Example 3, the sample which was cured by irradiating UV radiation in an energy of 500 mJ/cm$^2$ was measured for tack strength, and the tack strength between stainless steel SUS and adhesive layer was also measured when only the adhesive film was used instead of the dicing/die bonding tape.

force) between the adhesive layer and the die bonding layer remains constant. The chips having the bonding layer attached thereto can then be firmly bonded to lead frames by joining them together through heat compression and heat curing. The invention insures consistent and improved dicing, chip picking-up, and die bonding.

Japanese Patent Application No. 2003-121717 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A dicing/die bonding adhesion tape comprising a substrate, a silicone adhesive layer directly on the substrate, which silicone adhesive layer is formed by heat curing a silicone adhesive composition comprising a heat curable chain-like organopolysiloxane and an organopolysiloxane copolymer resin composed of $R^1{}_3SiO_{1/2}$ units and $SiO_2$ units wherein $R^1$ is a substituted or unsubstituted monovalent hydrocarbon radical and wherein the molar ratio of $R^1{}_3SiO_{1/2}$ units to $SiO_2$ units is from 0.5 to 1.5, and a bonding layer directly on the silicone adhesive layer, wherein

TABLE 1

| | Example | | | | | | Comparative Example | | | |
|---|---|---|---|---|---|---|---|---|---|---|
| | 1 | 2 | 3 | 4 | 5 | 6 | 1 | 2 | 3 | 4 |
| Dicing/die bonding tape | I | II | III | IV | V | VI | VII | VIII | IX | X |
| Adhesive film | silicone adhesive film I | silicone adhesive film II | silicone adhesive film III | silicone adhesive film VI | silicone adhesive film VII | silicone adhesive film II | silicone adhesive film IV | silicone adhesive film V | UV-curable adhesive film I | silicone adhesive film II |
| Bonding film | I | I | I | I | I | II | I | I | I | III |
| Tack strength of adhesive film to bonding layer (N/25 mm) | 0.32 | 0.85 | 1.8 | 0.82 | 0.54 | 0.78 | 0.16 | 2.3 | 2.8* | 0.52 |
| Tack strength of adhesive film to bonding layer after UV exposure (N/25 mm) | — | — | — | — | — | — | — | — | 13** | — |
| Chip scatter upon dicing | no | no | no | no | no | no | scattered | no | no | no |
| Chip pickup | OK | OK | OK | OK | OK | OK | OK | impossible | impossible | OK |
| Bond strength (MPa) | 14 | 15 | 13 | 14 | 18 | 15 | 13 | — | — | 8 |
| Post-PCT bond strength (MPa) | 12 | 13 | 10 | 12 | 14 | 11 | 11 | — | — | 0.4 |

*tack strength of adhesive layer to SUS when SUS is used instead of the bonding layer: 2.3 N/25 mm

**tack strength of adhesive layer to SUS when SUS is used instead of the bonding layer: 0.13 N/25 mm The dicing/die bonding adhesion tape of the invention has the advantages that when a wafer is bonded to the bonding layer of the tape by heat compression, the wafer is secured at a sufficient level to withstand dicing, that after the dicing, chips having the bonding layer attached thereto can be smoothly picked up, and that the tack strength (or bonding the tack strength between the silicone adhesive layer and the bonding layer is 0.2 to 2.0 N/25 mm, and said bonding layer is formed of an bonding composition comprising (A) a polyimide resin, (B) an epoxy resin, and (C) an epoxy resin curing catalyst.

2. The adhesion tape of claim 1, wherein the substrate is an extensible film.

3. The adhesion tape of claim 2, wherein the extensible film is polyethylene or polypropylene.

4. The adhesion tape of claim 1, wherein the silicone adhesive composition is an organic peroxide curing type or a platinum addition curing type silicone adhesive composition.

5. The adhesion tape of claim 1, wherein the polyimide resin (A) in the bonding composition has phenolic hydroxyl radicals on its polymer skeleton.

6. The adhesion tape of claim 1, wherein the polyimide resin (A) in the bonding composition has a siloxane structure in its polymer skeleton.

7. The adhesion tape of claim 1, wherein the silicone adhesive composition has the formula

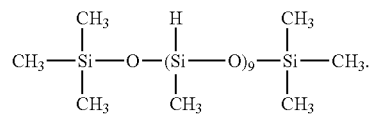

8. The adhesion tape of claim 1, wherein the tack strength between the silicone adhesive layer and the bonding layer is 0.32 to 1.8 N/25 mm.

9. The adhesion tape of claim 1, wherein the bond strength ranges from 13 to 18 MPa.

* * * * *